United States Patent
Talwar et al.

(10) Patent No.: US 6,388,297 B1
(45) Date of Patent: May 14, 2002

(54) STRUCTURE AND METHOD FOR AN OPTICAL BLOCK IN SHALLOW TRENCH ISOLATION FOR IMPROVED LASER ANNEAL CONTROL

(75) Inventors: Somit Talwar, Palo Alto, CA (US); John Cronin, Milton, VT (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/547,834

(22) Filed: Apr. 12, 2000

(51) Int. Cl.$^7$ ............................................... H01L 21/20

(52) U.S. Cl. ....................................... 257/396; 257/436

(58) Field of Search ................................ 257/374, 431, 257/432, 436, 396, 499, 501, 506, 510, 520, 649, 918, 507

(56) References Cited

U.S. PATENT DOCUMENTS 5,747,866 A * 5/1998 Ho et al. ...................... 257/506
6,156,654 A * 12/2000 Ho et al. ...................... 438/683

* cited by examiner

Primary Examiner—David Nelms
Assistant Examiner—David Nhu
(74) Attorney, Agent, or Firm—Allston L. Jones

(57) ABSTRACT

A shallow trench isolation (STI) structure (170, 300), formed in a silicon substrate (110) for use in sub-micron integrated circuit devices, for providing enhanced absorption of a wavelength of laser light during laser annealing. The STI structure includes a shallow trench (140) having a depth of 0.5 μm or less etched in the silicon substrate, and an optical blocking member (174, 304) that includes an insulator (144, 224) formed in the shallow trench and designed to reflect or absorb the wavelength of laser light to mitigate redistribution of the dopant and/or recrystallization of a portion of the silicon substrate. Methods of forming the optical blocking member are also disclosed.

6 Claims, 6 Drawing Sheets

STRUCTURE AND METHOD FOR AN OPTICAL BLOCK IN SHALLOW TRENCH ISOLATION FOR IMPROVED LASER ANNEAL CONTROL

BACKGROUND OF THE INVENTION

1. Field of the Invention

The present relates to semiconductor devices, and in particular methods and structures pertaining to shallow trench isolations (STIs)

2. Description of the Related Art

In semiconductor integrated circuits (ICs), millions of metal-oxide-semiconductors (MOS) transistors are formed on typical silicon substrates produced by Very Large Scale Integration (VLSI) processing methods. To create isolation and to assist in preventing short circuits between adjacent MOS transistors, an insulation structure between these MOS devices are formed. An oxide filled recessed oxide structure (ROX), or an oxide filled STI (shallow trench isolation) structure, is typically used for isolation. These structures are formed around the MOS device active regions. STI structures have been used for many years in the semiconductor industry to maintain isolation between devices, as well as between diffusion regions. STI structures have found favor because they create a near planar surface in the silicon substrate, which is useful for subsequent processing that involves photolithography, since planar structures provide a constant "depth of field" for imaging.

Referring to FIG. 1A to FIG. 1D, a conventional method of fabricating an STI structure on a substrate 10 having an upper surface 12 is described. In FIG. 1A, a thin pad nitride 16 is first formed on upper surface 12, followed by a thin pad oxide layer 20, resulting in a combined layer 24. Using chemical vapor deposition (CVD), a silicon nitride layer 30 is formed on pad oxide layer 20. A photo-resist layer 34 is then formed and patterned on silicon nitride layer 30.

The photo-resist layer is applied, image exposed and developed to created an imaged photo-resist layer. This imaged photo-resist layer 34 is used as a mask over the silicon nitride layer 30, pad oxide layer 20, and substrate 10. This mask is used in conjunction with a directional etch to form a trench 40, as shown in FIG. 1B. Trench 40 penetrates partially into substrate 10.

With reference now to FIG. 1C, photo-resist layer 34 is removed. Trench 40 is then filled with an oxide layer 46 (e.g., silicon oxide layer) formed by atmospheric pressure CVD (APCVD) with tetra-ethyl-ortho-silicate (TEOS) as a gas source. In the case of a TEOS base oxide layer, a process of densification is performed after deposition at about 1000 degrees C. for 10 min to 30 min.

With reference now to FIG. 1D, using chemical-mechanical polishing (CMP), TEOS base silicon oxide layer 46 is removed, with silicon nitride layer 30 serving as a polish stop layer. This forms an oxide plug 50 within trench 40. Since oxide plug 50 is softer than silicon nitride layer 30, during CMP, a recess (not shown) is formed in the junction between oxide plug 50 and the silicon nitride layer 30.

With reference now to FIG. 1E, silicon nitride layer 30 is etched using a CF4+O2 isotropic plasma etch, which stops at the top of pad oxide 20 and does not etch oxide plug 50. This etch exposes combined layer 24.

In FIG. 1F, oxide plug 50 and pad oxide 20 are subject to chemical-mechanical polish (CMP). The polishing stops at the top of pad nitride layer 16. Pad nitride layer 16, which is very thin, can be removed by a wet etch strip. This is followed by a thermal oxidation and growth of a gate oxide. A MOS transistor is then formed using conventional methods.

Thermal annealing techniques are also used in semiconductor manufacturing for a variety of reasons, including activating dopants within a device. Thermal annealing processing involves heating a substrate (e.g., a silicon wafer). One type of heating or annealing used in VLSI processing is Laser Thermal Annealing (LTA). LTA is performed with laser light of a given wavelength, which is absorbed by the different regions of the substrate on which the device is formed, thereby heating these regions. Because of the different thermal and optical properties of the substrate to be processed, different regions of the substrate heat to different temperatures. For instance, a polysilicon gate electrode is optically different than an amorphized silicon region, which is once again optically different than an STI region. An STI region, filled with oxide, is essential transparent to the wavelength of light used in laser thermal annealing. Accordingly, the region of the substrate under the STI is heated since this region absorbs light. This can cause redistribution of dopant under the gate, or can liquify the silicon under the STI. This, in turn, can cause stress and hence dislocations in the silicon substrate, as well as possibly movement of the STI region.

Therefore, when performing LTA, it is important to be able to anneal certain regions on the substrate to a greater degree than others. It is thus necessary to be able to control the optical properties of the different regions of the substrate, independent of the physical or device requirements. of the regions. This would allows maximum flexibility in laser annealing processing, and provide a large degree of freedom with regard to the amount of laser energy able to be coupled to different regions of the semiconductor substrate. Unfortunately, the transparent nature of oxides used in forming STI structures has, to date, limited the control and successful application of laser thermal annealing because of the above-described adverse effects on the underlying substrate due to heating of the region beneath the STI structure.

SUMMARY OF THE INVENTION

The present invention relates to semiconductor devices, and in particular methods and structures pertaining to shallow trench isolations (STIs).

A first aspect of the invention is an STI structure (hereinafter, simply "STI") formed in a silicon substrate, capable of absorbing laser light, for use in sub-micron integrated circuit devices. The STI of the present invention provides reduced absorption of a wavelength of laser light during laser annealing, and comprises a shallow trench of 0.5 µm or less etched in the silicon substrate. The reduced light absorption is obtained by the addition of an, optical blocking member comprising an insulator designed to reflect or absorb the wavelength of laser light, formed in the shallow trench. The optical blocking member is preferably between 100 and 500 angstroms thick and is designed to reflect or absorb a sufficient amount of the wavelength of laser light so as to mitigate diffusion of dopants and/or recrystallization of a portion of the silicon substrate. In a preferred embodiment, the optical blocking member comprises silicon nitride. The optical blocking member has a thickness that is equal to or less than the width of the trench.

A second aspect of the invention is a method of forming an STI. The STI is formed in a silicon substrate having an upper surface. The method comprises the steps of first, forming in the silicon substrate a trench having an inner surface and lower wall, then forming a first insulator layer within the trench conformal with the inner surface and the lower wall, and a second insulator layer within the trench conformal with the inner surface and the lower wall, the second insulating layer capable of reflecting or absorbing a wavelength of light used in laser annealing. The final step is then forming a third insulating layer atop the second insulating layer so as to fill the trench. The first insulating layer serves as an optical blocking member that reflects or absorbs the wavelength of light used in laser annealing so that the region of the substrate underneath the STI is not heated by absorption of the wavelength of light during laser-annealing.

A third aspect of the invention is another method of forming in a silicon substrate having an upper surface, a shallow trench isolation having an optical blocking member therein. The method comprises the steps of first, forming a trench having an inner surface and lower wall in the silicon substrate. The next step is forming a first insulator layer within the trench conformal with the inner surface and the lower wall. The next step is forming a second insulating layer atop the first insulating layer. This second insulating layer is capable of reflecting or absorbing a wavelength of light used in laser annealing. The final step is forming a third insulator layer atop the second insulating layer that fills the trench. The second insulating layer is removed from the lower wall of the trench by the first insulating layer, and serves as an optical blocking member that absorbs the wavelength of light used in laser annealing so that the region of the substrate underneath the STI is not heated by absorption of the wavelength. of light during laser annealing. The optical blocking member formed by this method can have a width equal to or less than the width of the trench. Thus, the width of the optical blocking member can be varied to control the amount of absorption of light within the STI.

DETAILED DESCRIPTION OF THE INVENTION

The present relates to semiconductor devices, and in particular methods and structures pertaining to shallow trench isolations (STIs). In particular, the present invention is a structure and method pertaining to forming an optical blocking member in an STI in a substrate, such as a silicon wafer. The optical blocking member of the present invention is designed to reflect or absorb a wavelength of light used in laser thermal annealing (such wavelength generally ranging between 0.3 and 1.5 microns), thereby preventing unwanted heating of the substrate region underlying the STI. The thickness of the optical blocking member can be adjusted to absorb different wavelengths of light, but is ideally designed to reflect or absorb the range of the LTA light.

First Embodiment

With reference now to FIGS. 2A–2G, a first embodiment of a method according to the present invention of fabricating an STI with an optical blocking member in a substrate 110 having an upper surface 112 is now described. Substrate 110 is preferably a silicon wafer such as those used in making semiconductor devices.

Figure 1A:
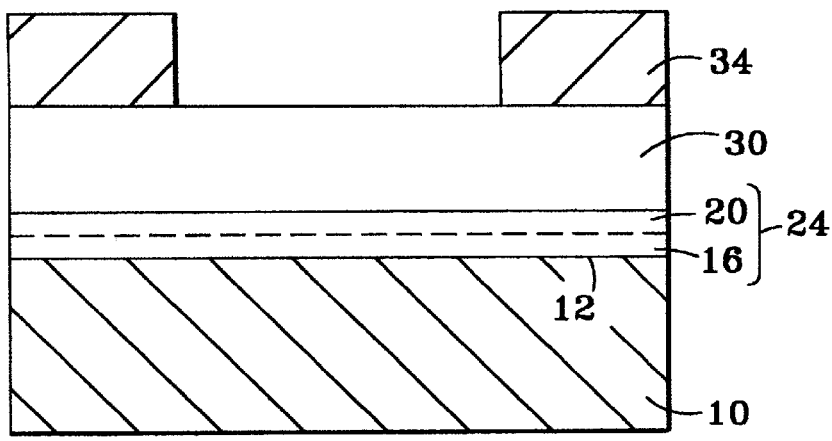
FIGS 1A–1F are cross-sectional schematic diagrams of a semiconductor substrate illustrating the method steps associated with a prior art method of forming an STI.
Figure 1B:
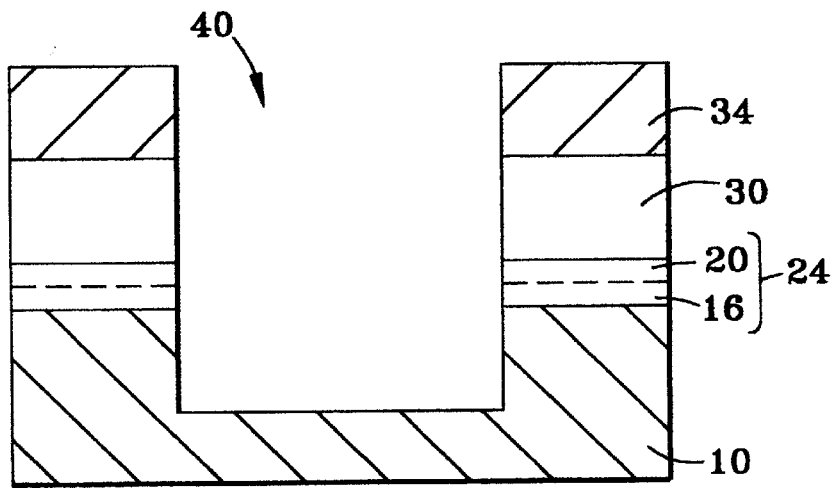
Figure 1C:
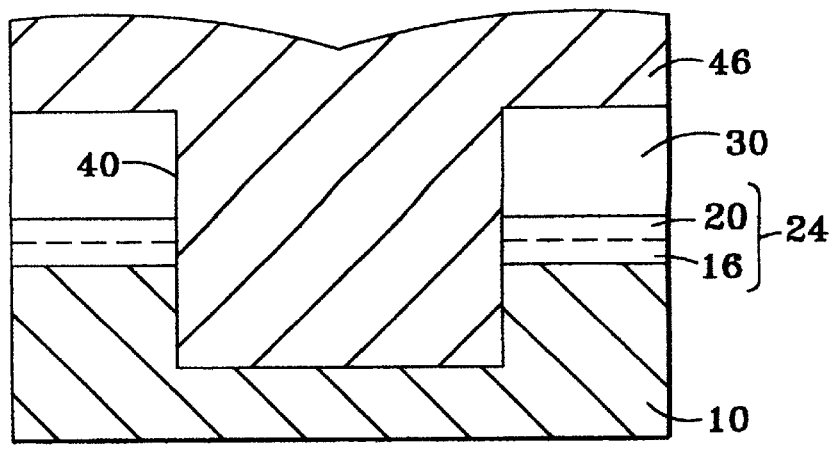
Figure 1D:
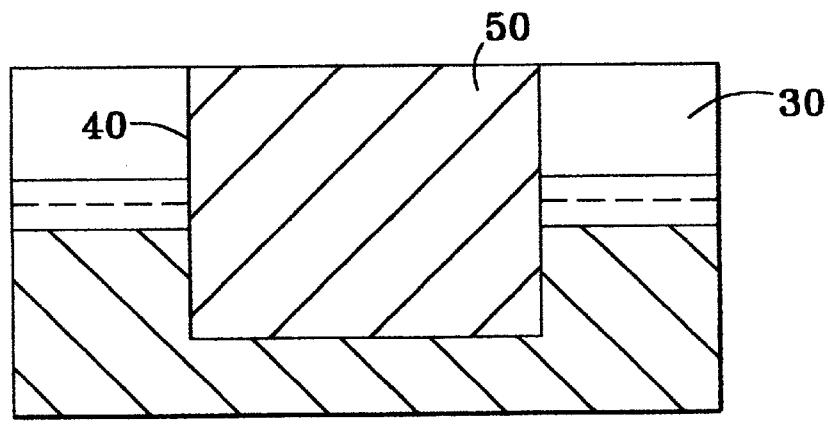
Figure 1E:
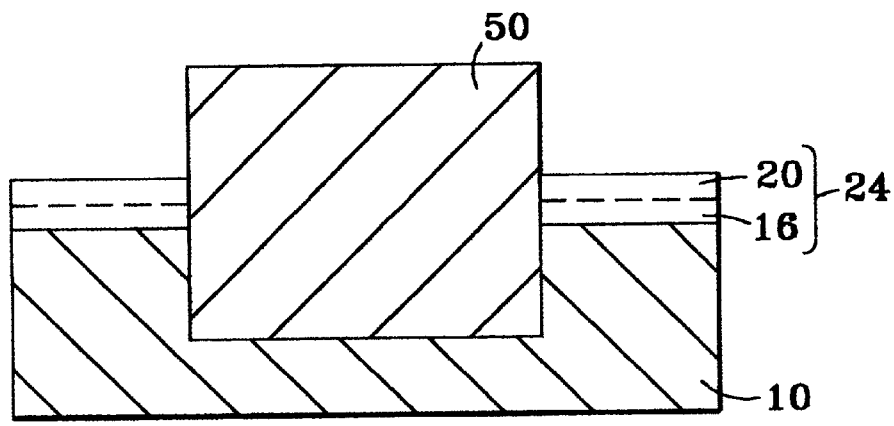
Figure 1F:
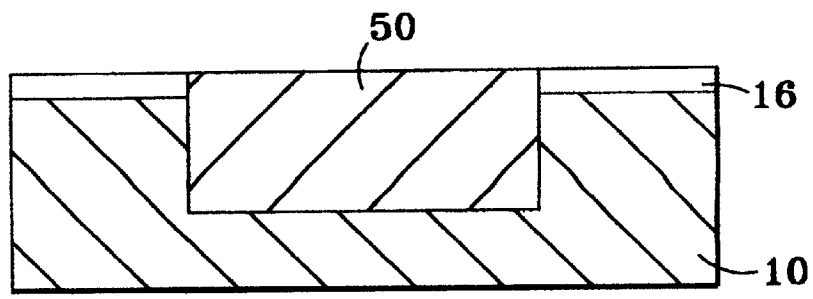
Figure 2A:
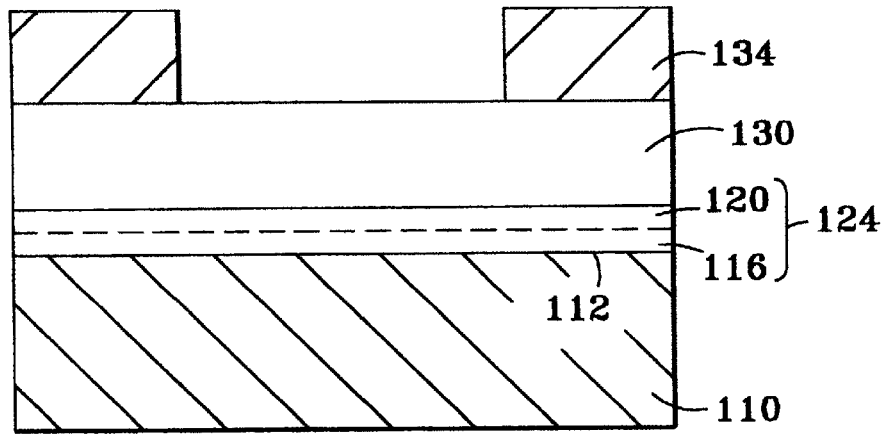
FIGS. 2A–2G are cross-sectional schematic diagrams of a semiconductor substrate illustrating the method steps associated with a first embodiment of the present invention of forming an STI having an optical blocking member therein.

With reference first to FIG. 2A, a thin pad nitride layer 116 is first formed on upper surface 112 of substrate 110, followed by a thin pad oxide layer 120, thereby creating a combined layer 124. A first silicon nitride ($Si_3N_4$) layer 130 is then formed on the pad oxide layer 120 using, for example, chemical vapor deposition (CVD). A photo-resist layer 134 is then formed and patterned on silicon nitride layer 130 using known photolithographic techniques.

Figure 2B:
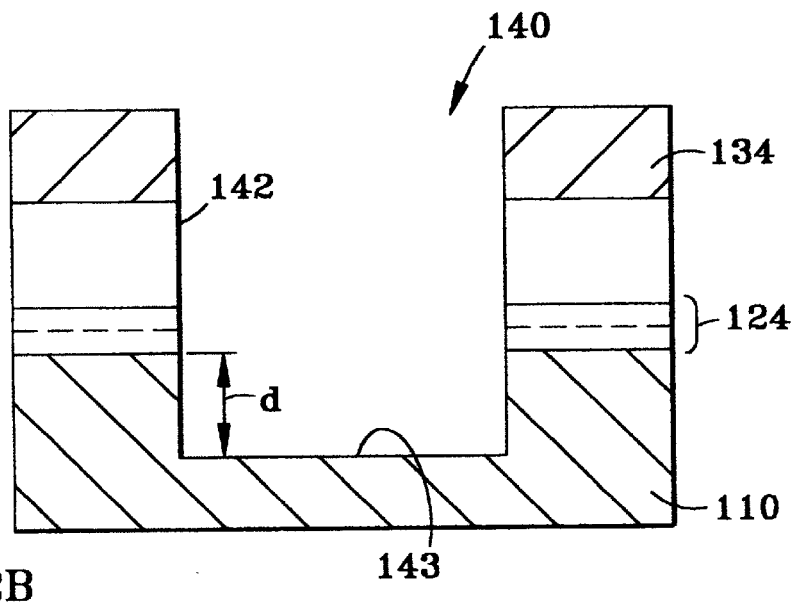

With reference now to FIG. 2B, using photo-resist layer 134 as a mask, silicon nitride layer 130, pad combined layer 124, and substrate 110 are etched, thereby forming a trench 140 having an inner surface 142 and a lower wall 143, as shown in FIG. 2B. Trench 140 penetrates partially into substrate 110 to a depth d of about 0.5 microns or less.

Figure 2C:
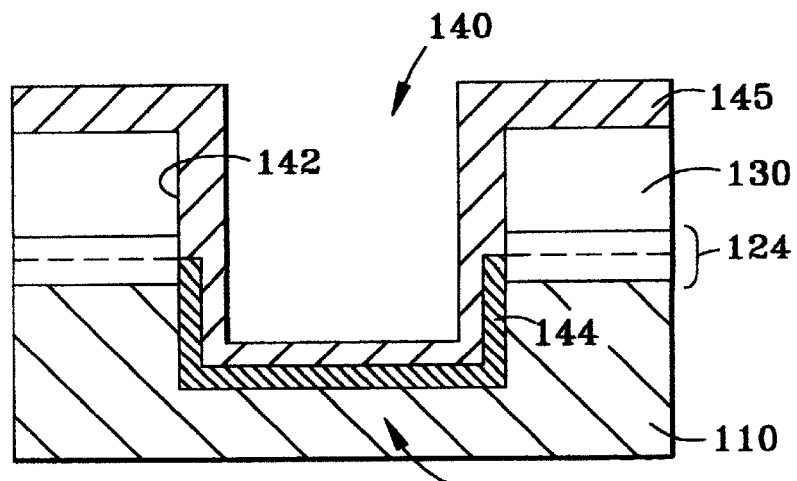

With reference now to FIG. 2C, photo-resist layer 134 is stripped and a combination of a first insulating layer 144 and then a silicon nitride layer 145 as a second insulating layer is deposited over the structure, as shown. Insulating layer 144 covers inner surface 142 and lower wall 143, and may be grown around STI trench 140 or deposited by CVD, as is preferred for silicon nitride layer 145. In FIG. 2C, the first insulating layer 144 is grown using thermal oxidation. Silicon nitride layer 145 is preferably between about 100 and 500 angstroms thick. The exact thickness of silicon nitride layer 145 depends upon the optical properties of the silicon nitride layer stoichiometry and the wavelength of light to be used in future laser annealing of the junctions. The purpose of silicon nitride layer 145 is to block a large percentage of light during laser annealing so that this light does not heat region 182 underlying the STI. Present day minimum feature STI dimensions are in the order of 0.18 microns. Accordingly, the addition of a 0.03 micron silicon nitride layer, for example, leaves 0.12 microns minimum dimension to fill, which is within the acceptable range for TEOS fill, given an STI depth d (see FIG. 2B) on the order of 0.3 microns. This provides about a 2:1 aspect ratio fill. The required thickness of silicon nitride layer 145 can be calculated using known techniques and any one of several commercial thin film/optical interference computer programs available in the market. The thickness of silicon nitride layer 145 is preferably chosen so that the light absorbed under the STI is equal to or less than the light absorbed in the source/drain regions of the device to be formed.

Figure 2D:
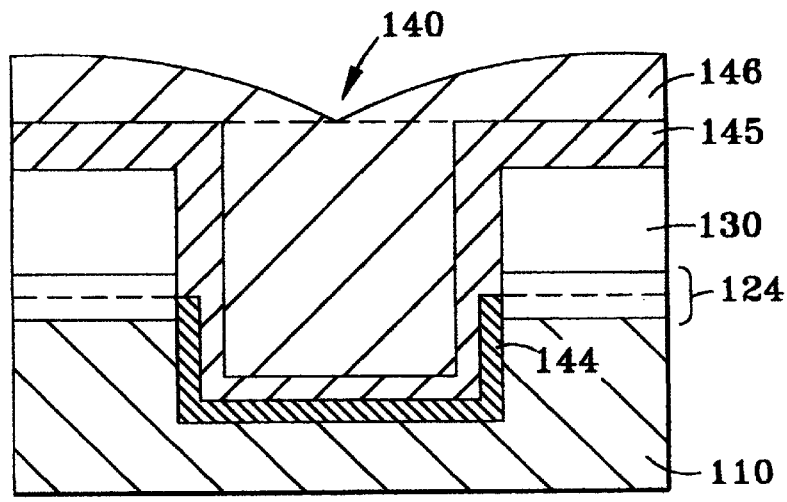

With reference now to FIG. 2D, trench 140 is filled with an insulating layer 146 (e.g., an oxide layer, such as silicon oxide). Insulating layer 146 may be formed, for example, as an oxide layer by atmospheric pressure CVD (APCVD) with tetra-ethyl-ortho-silicate (TEOS) as a gas source. In the case where insulating layer 146 is a TEOS-based oxide, a process of densification is performed after deposition at about 1000 degrees C. for 10 min to 30 min. Insulating layer 146 is substantially transparent to a wavelength of laser light used in laser thermal annealing of semiconductor devices.

Figure 2E:
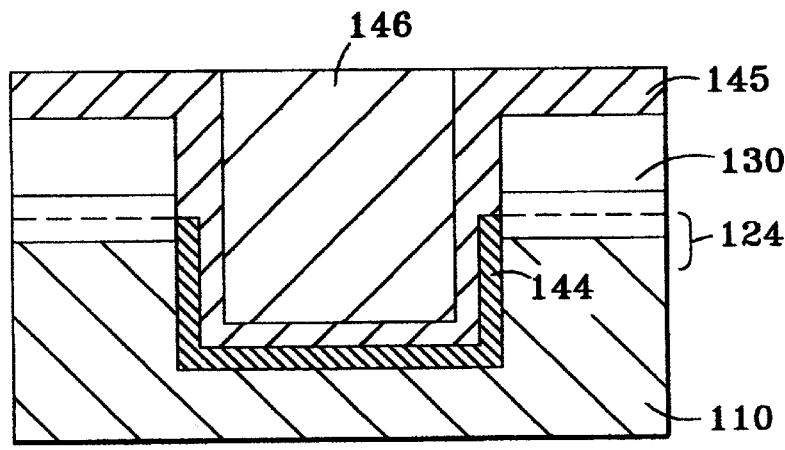

With reference now to FIG. 2E, insulator layer 146 of FIG. 2D is polished using, for example, CMP, down to silicon nitride layer 145.

Figure 2F:
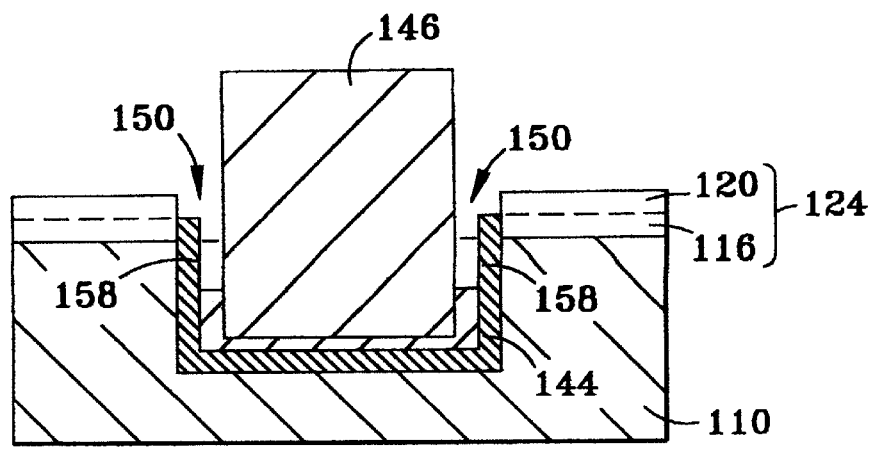

With reference now to FIG. 2F, second silicon nitride layer 145 and first silicon nitride layer 130 of FIG. 2E are directionally etched back using, for example, a standard CF4+O2 Reactive Ion Etch (RIE), thereby forming open spacer regions 150. This etch is selective to insulating layer 146, so that insulating layer 146 and pad oxide layer 120 atop thin pad nitride layer 116 remain.

Figure 2G:
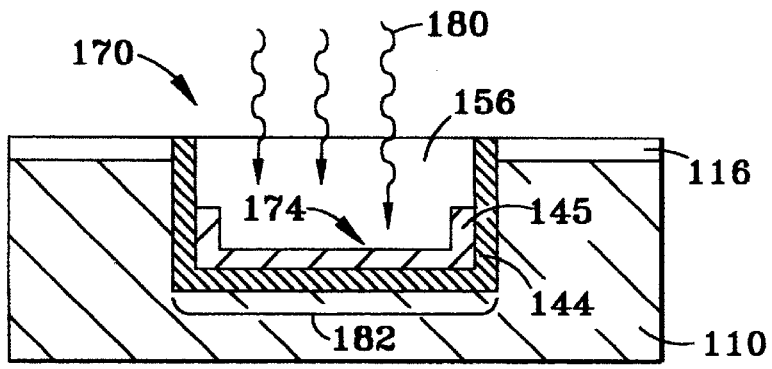

With reference now to FIG. 2G, insulating layer 146 is polished back stopping on pad nitride layer 116, thereby forming a planarized insulating region 156. Pad nitride layer 116 is then also polished away. Insulating material from insulating layer 146 is also polished into spacer regions 150 (see FIG. 2F), and contributes to the formation of insulating region 156.

Optionally, a second thin oxide layer 158 (dashed line in FIG. 2F) may be deposited to fill spacer regions 150. This step is optional if the preceding step does not successfully fill spacer regions 150.

It may be desirable to oxidize silicon nitride layer 116 prior to polishing to insure it is converted to oxide, since this material, along with insulating material from insulating layer 146, fills open spacer regions 150 and contributes to the formation of insulator region 156. Also, silicon nitride should be eliminated from the surface of the resulting structure shown in FIG. 2G to the extend possible, as an insulator/nitride interface can hold a charge, which can prove detrimental to device performance.

With continuing reference to FIG. 2G, the resulting STI structure 170 now includes an optical blocking member 174 in the form of silicon nitride layer 145 capable of reflecting or absorbing a wavelength of light (as indicated by light rays 180) used in laser thermal annealing so that region 182 of substrate 10 underlying optical blocking member 174 is not substantially heated by the absorption of light therein.

Second Embodiment

A second embodiment of the method of forming an STI with an optical blocking member according to the present invention is now described. The first steps of the second embodiment of the method are as described above in connection with the first embodiment with reference to FIGS. 2A and 2B.

Figure 3A:
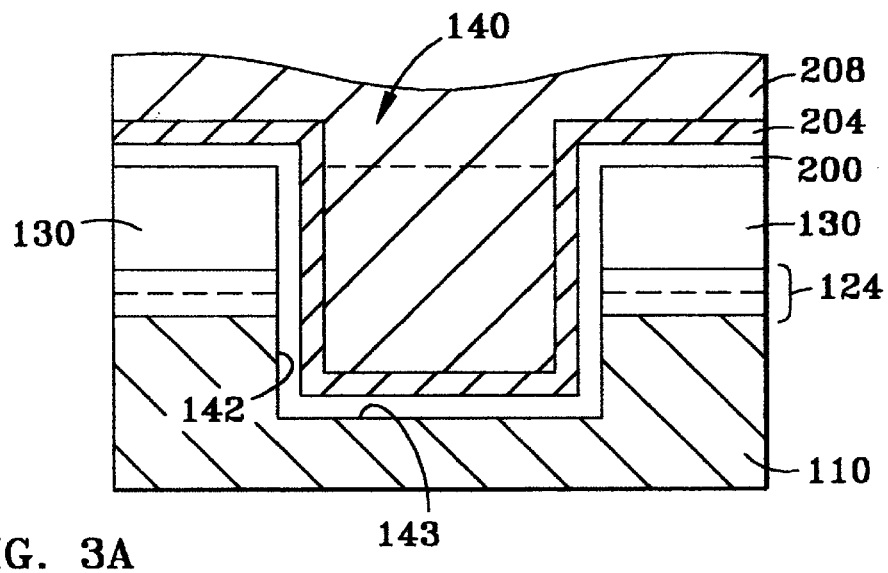
FIGS. 3A–3E are cross-sectional schematic diagrams of a semiconductor substrate illustrating the method steps associated with a second embodiment the present invention, of forming an STI having an optical blocking member therein.

Referring now to FIG. 3A, in the second embodiment of the present invention, a combination of a first insulating layer 200 and then a silicon nitride layer 204 as a second insulating layer is deposited over the structure, as shown. Insulating layer 200 covers inner surface 142 and lower wall 143, and may be grown around STI trench 140 or deposited by CVD, as is preferred for silicon nitride layer 204. A resist layer 208 is then is spin-applied over silicon nitride layer 204 so as to fill the remainder of trench 140.

Figure 3B:
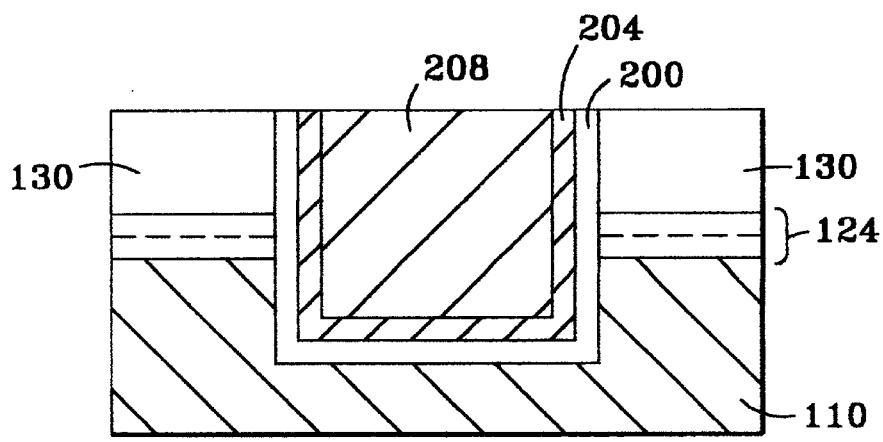

With reference now to FIG. 3B, in the next step, resist layer 208 is then directionally etched back so as to be planar with and expose silicon nitride layer 130. Alternatively, at this point, etching could continue so that resist layer 208 is made planer with pad oxide layer 120 (top of combined layer 124).

Figure 3C:
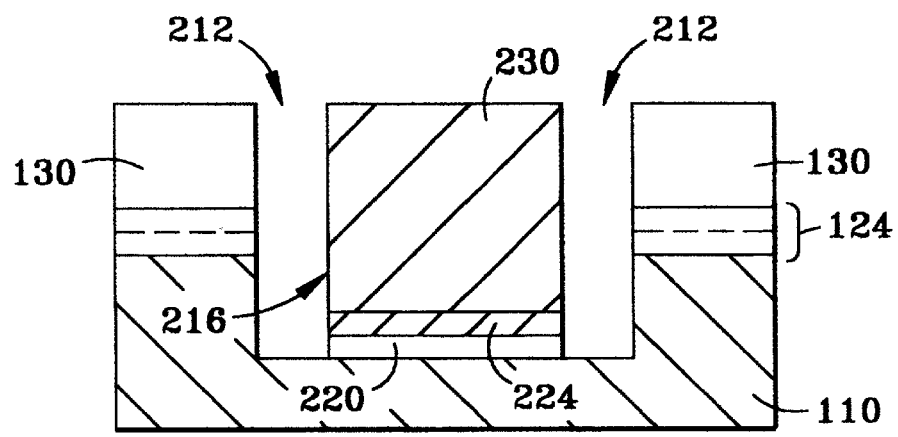

With reference now to FIG. 3C, silicon nitride layer 204 and insulating layer 200 are directionally etched (in an oxide, nitride 1:1 etch rate ratio using the appropriate percentage of a gas mixture of CF4+O2) away in the regions not covered by resist layer 208, leaving gaps 212 on either side of an, insulator-nitride-resist stack 216 (i.e., a first insulator-second insulator-mask stack) comprising an insulator section 220 from insulating layer 200, a silicon nitride section 224 from silicon nitride layer 204, and resist section 230 from resist layer 208.

Figure 3D:
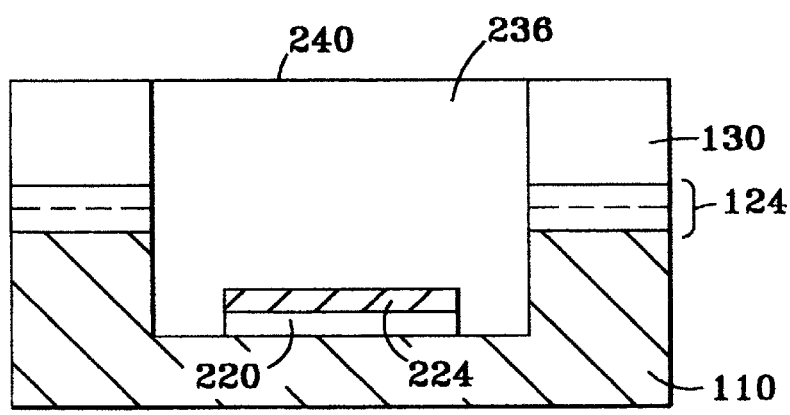

With reference now to FIG. 3D, resist section 230 is removed, and gaps 212 are filled with a third insulator to form an insulator region 236 with an upper surface 240. The third insulator material is preferably the same as the insulator material in first insulator layer 200, and is substantially transparent to a wavelength of light used in laser annealing. In this way, nitride section 224 is encompassed by the same insulator material on all sides.

Figure 3E:
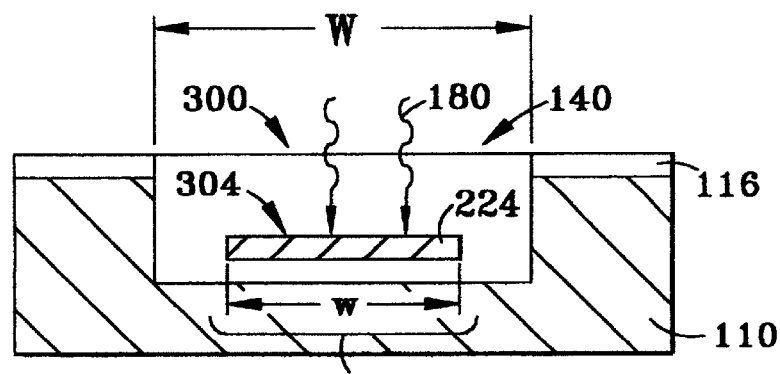

With reference now to FIG. 3E, upper surface 240 of insulator region 236 is polished down to be at the same level with pad nitride layer 116 (if this step has not already been performed), resulting in a final STI structure 300 having an optical blocking member 304 in the form of nitride region 224 having a width w. Optical blocking member 304, like optical blocking member 174 of the first embodiment of the present invention, is capable of reflecting or absorbing light (as indicated by light rays 180) so that region 182 of substrate 110 underlying optical blocking member 304 is not heated to a significant degree by the absorption of light therein. Using the method of the second embodiment described above, width w of optical blocking member can be adjusted to span a given portion of width W of trench 140.

While the present invention has been described in connection with preferred embodiments, it will be understood that it is not so limited. In addition, it will be understood that the precise film thicknesses and other parameters associated with practicing the present invention may best be determined empirically rather than analytically, as is common in the art of semiconductor processing. Accordingly, the present invention is intended to cover all alternatives, modifications and equivalents as may be included within the spirit and scope of the invention as defined in the appended claims.

What is claimed is:

1. A shallow trench isolation structure, formed in a silicon substrate for use in a sub-micron integrated circuit, for providing reduced absorption of a wavelength of laser light under the trench isolation structure during laser annealing, comprising:

a shallow trench of 0.5 $\mu$m or less etched in the silicon substrate; and an optical blocking member formed in said shallow trench and comprising an insulator material designed to reflect or absorb enough of the wavelength of laser light to mitigate redistribution of the dopant and/or crystallization of the silicon substrate.

2. A shallow trench isolation structure according to claim 1, wherein said optical blocking member is between 100 and 500 angstroms thick.

3. A shallow trench isolation structure according to claim 2, wherein said optical blocking member comprises silicon nitride.

4. A shallow trench isolation structure according to claim 1, wherein said trench has a trench width, and said optical blocking member has an optical blocking member width equal to or less than said trench width.

5. A shallow trench isolation structure according to claim 1, wherein said optical blocking member is separated from the silicon substrate by an insulating layer of a different insulating material than said optical blocking member.

6. A shallow trench isolation structure according to claim 5, wherein the insulating material of the insulating layer is an oxide.

* * * * *